(12) United States Patent
Matsuzaki

(10) Patent No.: US 10,347,870 B2
(45) Date of Patent: Jul. 9, 2019

(54) LIGHT-EMITTING DEVICE INCLUDING CONCAVO-CONVEX BOUNDARY PATTERN

(71) Applicant: PANASONIC INTELLECTUAL PROPERTY MANAGEMENT CO., LTD., Osaka (JP)

(72) Inventor: Jumpei Matsuzaki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/746,231

(22) PCT Filed: Jul. 8, 2016

(86) PCT No.: PCT/JP2016/003239
§ 371 (c)(1),
(2) Date: Jan. 19, 2018

(87) PCT Pub. No.: WO2017/037987
PCT Pub. Date: Mar. 9, 2017

(65) Prior Publication Data
US 2018/0212196 A1 Jul. 26, 2018

(30) Foreign Application Priority Data

Aug. 31, 2015 (JP) ................. 2015-171264
Aug. 31, 2015 (JP) ................. 2015-171352

(51) Int. Cl.
*H01L 51/52* (2006.01)
(52) U.S. Cl.
CPC ...... *H01L 51/5262* (2013.01); *H01L 51/5275* (2013.01); *H01L 2251/533* (2013.01)

(58) Field of Classification Search
None
See application file for complete search history.

(56) References Cited

U.S. PATENT DOCUMENTS

2002/0122144 A1* 9/2002 Yoshida ............ G02F 1/133603
349/61
2012/0088319 A1 4/2012 Veerasamy et al.
(Continued)

FOREIGN PATENT DOCUMENTS

JP 2002-207434 7/2002
JP 2010-262851 11/2010
(Continued)

OTHER PUBLICATIONS

International Search Report (ISR) from International Searching Authority (Japan Patent Office) in International Pat. Appl. No. PCT/JP2016/003239, dated Aug. 30, 2016.

*Primary Examiner* — Su C Kim
*Assistant Examiner* — David S Wilbert
(74) *Attorney, Agent, or Firm* — Greenblum & Bernstein, P.L.C.

(57) ABSTRACT

A light-emitting device includes: a light-emitting layer; a first layer located on a light-emitting side of the light-emitting layer; and a second layer located on a light-emitting side of the first layer, and in contact with the first layer. A concavo-convex structure composed of a plurality of convex portions having two or more steps is formed at a boundary between the first layer and the second layer, a refractive index of the first layer is higher than a refractive index of the second layer, and a concavo-convex pattern of the concavo-convex structure is a pattern formed by a space-filling curve or a fractal tiling pattern.

15 Claims, 13 Drawing Sheets

(56) References Cited

U.S. PATENT DOCUMENTS

| | | | |
|---|---|---|---|
| 2013/0129919 A1 | 5/2013 | Veerasamy et al. | |
| 2013/0277703 A1* | 10/2013 | Matsuzaki | H01L 33/58 257/98 |
| 2014/0197403 A1* | 7/2014 | Hayashi | H05B 33/26 257/40 |

FOREIGN PATENT DOCUMENTS

| | | |
|---|---|---|
| JP | 4858337 | 1/2012 |
| JP | 5307307 | 10/2013 |
| JP | 2013-228656 | 11/2013 |
| JP | 2014-500783 | 1/2014 |
| JP | 2014-081656 | 5/2014 |
| JP | 2014-112515 | 6/2014 |
| JP | 2015-095383 | 5/2015 |
| WO | 2013/051633 | 4/2013 |
| WO | 2013/084442 | 6/2013 |

* cited by examiner

LIGHT-EMITTING DEVICE INCLUDING CONCAVO-CONVEX BOUNDARY PATTERN

TECHNICAL FIELD

The present invention relates to a light-emitting device.

BACKGROUND ART

The use of organic electroluminescent (EL) elements in various apparatuses as surface emitting devices has been examined. For example, Patent Literature (PTL) 1 proposes an organic EL element for lighting.

To efficiently extract light emitted from an organic EL element, a light emitting device having a light extraction layer on the light-emitting side of an organic EL element is proposed, too. The light extraction layer has, for example, a concavo-convex structure of a concavo-convex pattern in which a plurality of nano-order fine convex portions and concave portions are regularly arranged repeatedly. By using such a concavo-convex structure, total reflection of light can be suppressed to improve light extraction efficiency.

CITATION LIST

Patent Literature

PTL 1: Japanese Unexamined Patent Application Publication No. 2014-112515

SUMMARY OF THE INVENTION

Technical Problem

An organic EL element for lighting that emits white light is required to have low wavelength dependence of light extraction efficiency and low view angle dependence of chromaticity. With a light extraction layer having a concavo-convex structure of a concavo-convex pattern in which a plurality of fine convex portions (concave portions) are regularly arranged repeatedly, however, it is difficult to sufficiently satisfy this requirement.

In view of this, randomly arranging convex portions (concave portions) in a concavo-convex structure has been studied. By randomly arranging convex portions (concave portions), light can be extracted without a directional bias. This can reduce the wavelength dependence of light extraction efficiency, and reduce the view angle dependence of chromaticity.

However, if a plurality of convex portions or concave portions are randomly arranged, the following problem may arise. A lot of percolation in which convex portions gather or concave portions gather in the concavo-convex pattern forms, causing many parts of the concave-convex pattern to have no step corner of a convex portion (concave portion). To solve such a problem, the present invention has an object of providing a light-emitting device having excellent light extraction efficiency that can suppress percolation even in the case where a plurality of convex portions are randomly arranged in a concave-convex structure.

Solutions to Problem

To achieve the object stated above, a light-emitting device according to an aspect of the present invention includes: a light-emitting layer; a first layer located on a light-emitting side of the light-emitting layer; and a second layer located on a light-emitting side of the first layer, and in contact with the first layer, wherein a concavo-convex structure composed of a plurality of convex portions having two or more steps is formed at a boundary between the first layer and the second layer, a refractive index of the first layer is higher than a refractive index of the second layer, and a concavo-convex pattern of the concavo-convex structure is a pattern formed by a space-filling curve.

To achieve the object stated above, a light-emitting device according to another aspect of the present invention includes: a light-emitting layer; a first layer located on a light-emitting side of the light-emitting layer; and a second layer located on a light-emitting side of the first layer, and in contact with the first layer, wherein a concavo-convex structure composed of a plurality of convex portions having two or more steps is formed at a boundary between the first layer and the second layer, a refractive index of the first layer is higher than a refractive index of the second layer, and a concavo-convex pattern of the concavo-convex structure is a fractal tiling pattern.

Advantageous Effect of Invention

A light-emitting device having excellent light extraction efficiency that can suppress percolation even in the case where a plurality of convex portions are randomly arranged in a concavo-convex structure can thus be provided.

DESCRIPTION OF EXEMPLARY EMBODIMENTS

Figure 1A:
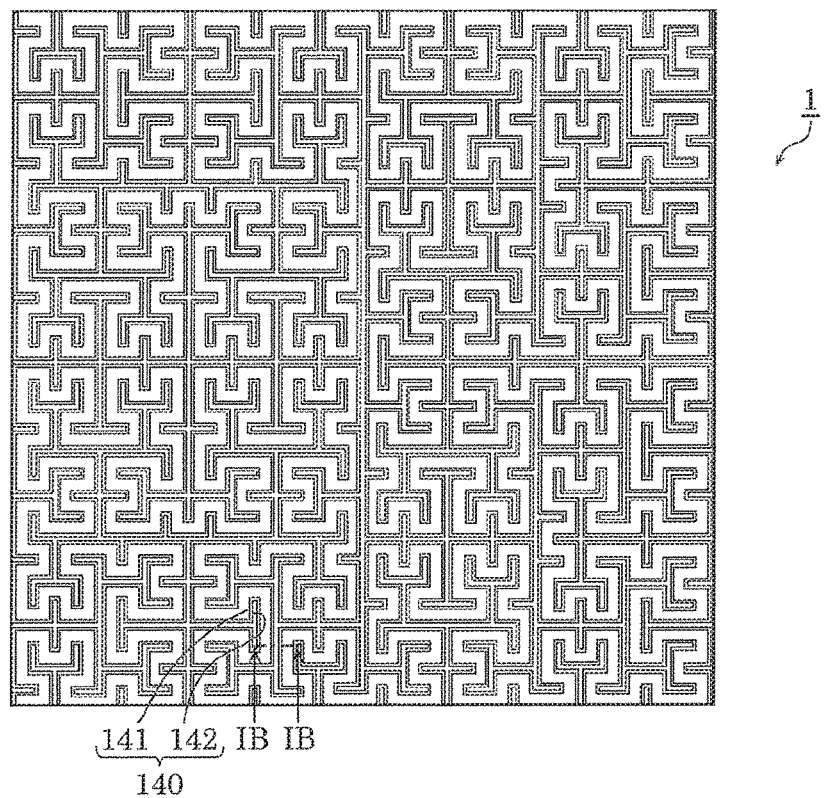
FIG. 1A is a plan view of a light-emitting device according to Embodiment 1.

The following describes embodiments of the present disclosure with reference to drawings. The embodiments described below each show a specific example of the present disclosure. The numerical values, shapes, materials, structural elements, the arrangement and connection of the structural elements, etc. shown in the following embodiments are mere examples, and do not limit the scope of the present disclosure. Of the structural elements in the embodiments described below, the structural elements not recited in any one of the independent claims representing the broadest concepts of the present disclosure are described as optional structural elements.

Each drawing is a schematic and does not necessarily provide precise depiction. The substantially same structural elements are given the same reference marks in the drawings, and repeated description is omitted or simplified.

Embodiment 1

Figure 1B:
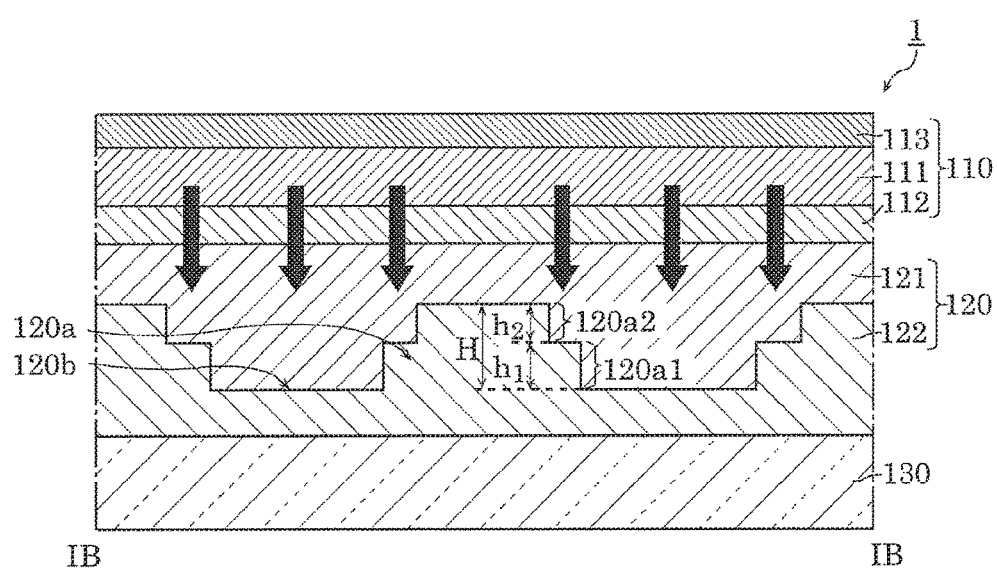
FIG. 1B is a sectional view of the light-emitting device according to Embodiment 1 along IB-IB line in FIG. 1A.

The structure of light-emitting device 1 according to Embodiment 1 is described below, with reference to FIGS. 1A and 1B. FIG. 1A is a plan view of light-emitting device 1 according to Embodiment 1, and illustrates a concavo-convex pattern of a concavo-convex structure of light extraction layer 120 as seen through organic EL layer 110. FIG. 1B is a sectional view of light-emitting device 1 along IB-IB line in FIG. 1A.

As illustrated in FIGS. 1A and 1B, light-emitting device 1 is a surface emitting device which surface-emits light, and includes: organic EL layer 110; and light extraction layer 120 located on the light-emitting side of organic EL layer 110. In this embodiment, light-emitting device 1 further includes substrate 130. Light-emitting device 1 is surrounded by an air layer (atmosphere), and the surface of substrate 130 is exposed to the air layer.

Organic EL layer 110 is provided on light extraction layer 120. Moreover, organic EL layer 110 is provided above substrate 130. In this embodiment, organic EL layer 110 emits light toward substrate 130 located below, as indicated by arrows in FIG. 1B. In other words, light-emitting device 1 is a bottom emission-type light-emitting device.

Organic EL layer 110 is, for example, an organic EL element that emits white light. Organic EL layer 110 includes light-emitting layer 111, first electrode 112, and second electrode 113.

Light-emitting layer is a surface emitting layer provided between first electrode 112 and second electrode 113. Light-emitting layer 111 is an organic light-emitting layer made of an organic light-emitting material. When a predetermined voltage is applied to first electrode 112 and second electrode 113, the organic light-emitting material is excited to emit light. As an example, light-emitting layer 111 has a refractive index of about 1.8.

First electrode 112 is an electrode layer provided between light extraction layer 120 and light-emitting layer 111. In this embodiment, first electrode 112 is provided on light extraction layer 120. In detail, first electrode 112 is provided on first layer 121 of light extraction layer 120. First electrode 112 is, for example, a transparent; electrode made of a transparent metal oxide such as indium tin oxide (ITC)) or indium zinc oxide (IZO). In this embodiment, first electrode 112 is an ITO film having a refractive index of 2.0. First electrode 112 may be a metal thin film, as long as it has light transmittivity.

Second electrode 113 is an electrode layer provided on light-emitting layer 111. Second electrode 113 is a reflection electrode having reflectivity. Second electrode 113 is, for example, a metal electrode (metal film) made of aluminum (Al), silver alloy APC, or the like.

Functional layers such as a hole injection layer, a hole transport layer, an electron transport layer, and an electron injection layer may be provided between first electrode 112 and second electrode 113, in addition to light-emitting layer 111. A seal layer made of resin or the like or a seal substrate made of glass or the like may be provided on organic EL layer 110 (second electrode 113). A transparent adhesion layer may be formed between substrate 130 and light extraction layer 120.

Light extraction layer 120 is located on the light-emitting side (light extraction side) of organic EL layer 110. Light extraction layer 120 is a light transmissive layer, and causes light emitted from organic EL layer 110 to enter substrate 130. In detail, light extraction layer 120 is provided on substrate 130. Light extraction layer 120 is thus provided between substrate 130 and organic EL layer 110. By providing light extraction layer 120, light from organic EL layer 110 can be extracted efficiently, thus improving the light extraction efficiency of light-emitting device 1.

Light extraction layer 120 includes first layer 121 (first light extraction layer) and second layer 122 (second light extraction layer). Light extraction layer 120 (first layer 121 and second layer 122) is, for example, an optical sheet made of a transparent resin material in sheet shape, and can be produced by nanoimprint or the like.

First layer 121 is located on the light-emitting side of light-emitting layer 111. In detail, first layer 121 is provided on the whole surface on the light-emitting side (light extraction side) of organic EL layer 110. First layer 121 transmits light from organic EL layer 110, toward second layer 122.

Second layer 122 is located on the light-emitting side of first layer 121, and is in contact with first layer 121. In detail, second layer 122 is provided on the whole surface on the light-emitting side (light extraction side) of first layer 121. Second layer 122 is in contact with substrate 130. Second layer 122 transmits light from first layer 121, toward substrate 130.

Substrate 130 transmits light from light extraction layer 120, toward the air layer. Substrate 130 is, for example, a light transmissive substrate such as a glass substrate or a transparent resin substrate. Substrate 130 may be any of a rigid substrate and a flexible substrate having flexibility. In this embodiment, substrate 130 is a glass substrate having a refractive index of 1.51.

In light extraction layer 120, the refractive index of first layer 121 is higher than the refractive index of second layer 122. In other words, first layer 121 is a high refractive index layer, and second layer 122 is a low refractive index layer. When the refractive index (effective refractive index) of first layer 121 is denoted by $n_1$ and the refractive index (effective refractive index) of second layer 122 is denoted by $n_2$, first layer 121 and second layer 122 satisfies the relationship of $n_1 > n_2$.

The refractive index ($n_1$) of first layer 121 is, for example, $1.51 \leq n_1 \leq 1.90$. In this embodiment, $n_1 = 1.80$. The refractive index ($n_2$) of second layer 122 is $1.01 \leq n_2 \leq 1.51$. In this embodiment, $n_2 = 1.50$.

When the refractive index of the air layer outside substrate 130 is denoted by $n_0$ (e.g. $n_0 = 1$), the refractive index of substrate 130 is denoted by $n_3$, and the refractive index of light-emitting layer 111 is denoted by $n_4$, a relational expression of $n_4 \geq n_1 \geq n_3 \geq n_0$ no may be satisfied. The refractive index of second layer 122 only needs to satisfy the relationship of $n_1 > n_2$ as mentioned above, and does not necessarily need to satisfy $n_2 > n_3$.

In light extraction layer 120, a concavo-convex structure (light extraction structure) composed of a plurality of convex portions 120a having two or more steps (multilevel) is formed at the boundary between first layer 121 and second layer 122. In other words, the interface between first layer 121 and second layer 122 is a concave-convex surface.

In detail, the concavo-convex structure of tight extraction layer 120 is a structure in which a plurality of nano-order (1 μm at the maximum) fine convex portions 120a and concave portions 120b are arranged. All of the plurality of convex portions 120a in the concavo-convex structure may have two or more steps. In other words, the plurality of convex portions 120a may include no convex portion having only one step (single level).

In this embodiment, all of the plurality of convex portions 120a (concave portions 120b) have a two step structure of two steps (double level). In detail, each convex portion 120a is composed of first step portion 120a1 and second step portion 120a2 located on first step portion 120a1. The diameter of first step portion 120a1 is greater than the diameter of second step portion 120a2.

When the height (length in the stack direction) of each convex portion 120a is denoted by H, for example, 0.2 μm≤H≤20 μm. When, in each convex portion 120a, the height of first step portion 120a1 is denoted by $h_1$ and the height of second step portion 120a2 is denoted by $h_2$, for example, 0.1 μm≤$h_1$≤10 μm and 0.1≤$h_2$≤10 μm.

The concavo-convex pattern of the concavo-convex structure composed of the plurality of convex portions 120a in light extraction layer 120 is a pattern formed by a space-filling curve, as illustrated in FIG. 1A. In detail, contour 140 of the step corner (edge) of convex portion 120a of the concavo-convex structure in light extraction layer 120 in a plan view of light-emitting device 1 is a pattern formed by the space-filling curve. The concave-convex pattern illustrated in FIG. 1A is formed using a Hilbert curve as the space-filling curve.

In this embodiment, convex portion 120a has two steps. Accordingly, contour 140 is a double line (two-line) and includes first contour 141 representing the first step and second contour 142 representing the second step, as illustrated in FIG. 1A.

Figure 2:
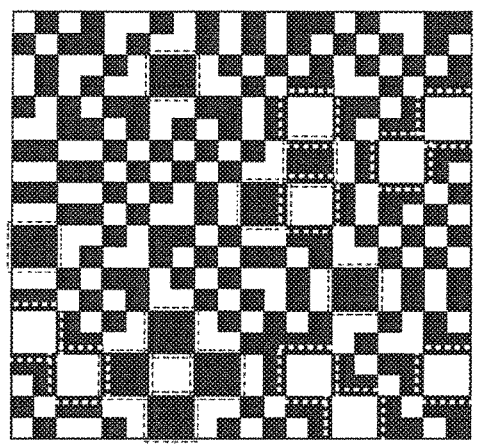
FIG. 2 is a diagram illustrating a concavo-convex pattern of a concavo-convex structure of a light extraction layer in a light-emitting device according to Conventional Example 1.
Figure 3:
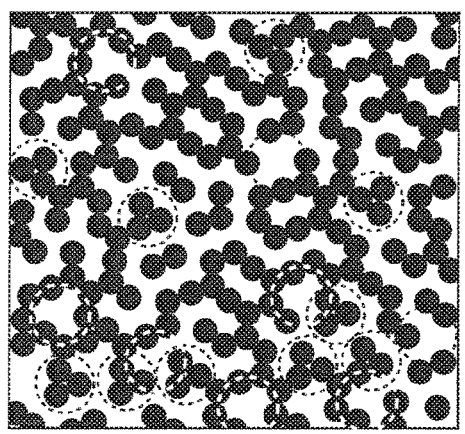
FIG. 3 is a diagram illustrating a concavo-convex pattern of a concavo-convex structure of a light extraction layer in a light-emitting device according to Conventional Example 2.

The functions and effects of light-emitting device 1 according to this embodiment are described below, in comparison with conventional light-emitting devices illustrated in FIGS. 2 and 3. FIG. 2 is a diagram illustrating a concavo-convex pattern of a concavo-convex structure of a light extraction layer in a light-emitting device according to Conventional Example 1. FIG. 3 is a diagram illustrating a concave-convex pattern of a concavo-convex structure of a light extraction layer in a light-emitting device according to Conventional Example 2.

Randomly arranging a plurality of convex portions or concave portions according to a random generation algorithm or the like to form a concavo-convex pattern of a light extraction layer yields, for example, a concavo-convex pattern illustrated in FIG. 2 or 3. In FIGS. 2 and 3, one of a first region in black and a second region in white represents a convex portion, and the other one of the first region and the second region represents a concave portion. In FIG. 2, convex portions or concave portions are randomly arranged like a grid. In FIG. 3, circular convex portions or concave portions are randomly arranged.

In these cases, however, successive convex portions or concave portions in the concavo-convex pattern causes a lot of percolation in which convex portions or concave portions gather, as indicated by dashed-line regions in FIGS. 2 and 3. In each part of the concavo-convex pattern where percolation occurs, there is no step corner (edge) of a convex portion (concave portion).

Thus, randomly arranging a plurality of convex portions or concave portions according to a random generation algorithm or the like can cause percolation and result in a state where many parts of the concavo-convex pattern have no step corner of a convex portion (concave portion). This decreases light extraction efficiency.

In view of this, in light-emitting device 1 in this embodiment, the concavo-convex structure formed at the boundary between first layer 121 and second layer 122 in light extraction layer 120 located on the light-emitting side of light-emitting layer 111 is composed of a plurality of convex portions 120a having two or more steps, and the concavo-convex pattern of the concavo-convex structure is formed by the space-filling curve.

With such a concavo-convex structure in light extraction layer 120 that is composed of a plurality of convex portions 120a each having two or more steps (i.e. a multilevel concavo-convex structure), excellent light extraction efficiency can be achieved. This is described below.

By providing the concavo-convex structure in light extraction layer 120, propagation light in an oblique direction from the step corner (edge) of the convex portion (concave portion) can be generated. Therefore, even in the case where light is incident at an incident angle greater than or equal to a critical angle, the light can be extracted. This seems to suggest that increasing the proportion of convex portions in the concavo-convex structure improves light extraction efficiency. However, simply increasing the proportion of convex portions causes narrower spacing between adjacent convex portions, and hinders sufficient improvement in light extraction efficiency. To effectively improve light extraction efficiency, the concavo-convex ratio (the ratio between convex portions and concave portions) in the concavo-convex structure is important.

Hence, in this embodiment, each convex portion 120a of the concavo-convex structure is formed with two or more steps (multilevel), instead of forming each convex portion of the concavo-convex structure with only one step (single level). In this way, an optimal concavo-convex ratio can be achieved without adjacent convex portions 120a being excessively close to each other. Hence, the presence ratio of the step corner of the convex portion (concave portion) can be at least doubled easily, as compared with the case where the step corner of convex portion 120a involves only one step (single level). Consequently, the proportion of converting incident light to propagation light can be increased. Moreover, incident light can be converted to propagation light in a wider range, than in the case of only one step (single level).

Thus, with such a concavo-convex structure in light extraction layer 120 that is composed of a plurality of convex portions 120a each having two or more steps, more propagation light in an oblique direction from the step corner (edge) of convex portion 120a (concave portion) can be generated. Since incident light can be efficiently converted to propagation light in the step portion of two or more steps of convex portion 120a (concave portion) as compared with the case where the convex portion in the concavo-convex structure has only one step (single level), light extraction efficiency can be improved greatly.

Moreover, in this embodiment, the concavo-convex pattern of the concavo-convex structure in light extraction layer 120 is formed by the space-filling curve. Multi-step convex portions 120a can therefore be efficiently arranged along the space-filling curve. In other words, many multi-step convex portions 120a can be minutely arranged with an optimal concavo-convex ratio, without adjacent convex portions 120a being excessively close to each other. In addition, by forming the concavo-convex pattern of the concavo-convex structure in light extraction layer 120 by the space-filling curve, a plurality of random directions of the step corner (edge) of convex portion 120a can be obtained. Thus, by forming the concavo-convex pattern by the space-filling curve, convex portions 120a can be randomly arranged to thereby eliminate the regularity of the concavo-convex structure, and also the proportion of the step corner of convex portion 120a per unit area can be optimized to achieve minuteness.

The following describes the results of simulation for light extraction efficiency performed on two texture structures, i.e. a texture structure in the case where the concavo-convex structure of the light extraction layer has a concavo-convex pattern formed by diffraction grating (comparative example) and a texture structure in the case where the concavo-convex structure of the light extraction layer has a concavo-convex pattern formed by the space-filling curve (this embodiment), with reference to FIGS. 4 to 9.

Figure 4:
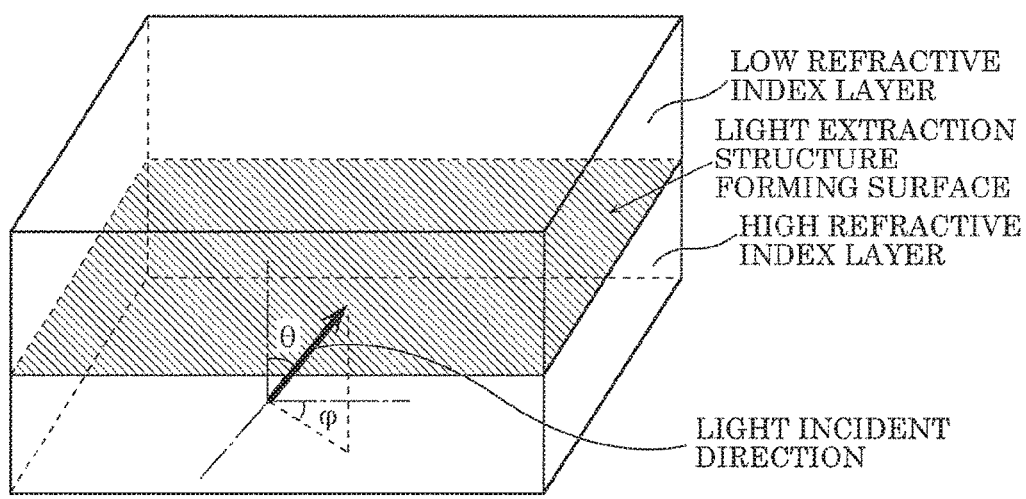
FIG. 4 is a model diagram of a light extraction aver having a stack structure of a high refractive index layer and a low refractive index layer.

FIG. 4 is a model diagram of a light extraction layer having a stack structure of a high refractive index layer and a low refractive index layer. A concavo-convex structure is formed at the interface (light extraction structure forming surface) between the high refractive index layer and the low refractive index layer in the light extraction layer in FIG. 4.

Figure 5A:
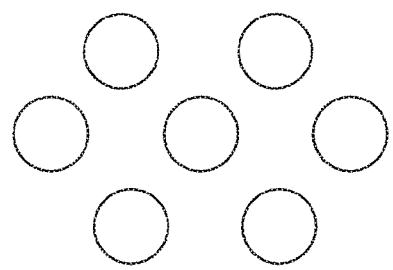
FIG. 5A is a diagram illustrating a concavo-convex pattern (diffraction grating pattern) as a basis of a concavo-convex structure in the interface of the high refractive index layer and the low refractive index layer in the light extraction layer in FIG. 4.
Figure 5B:
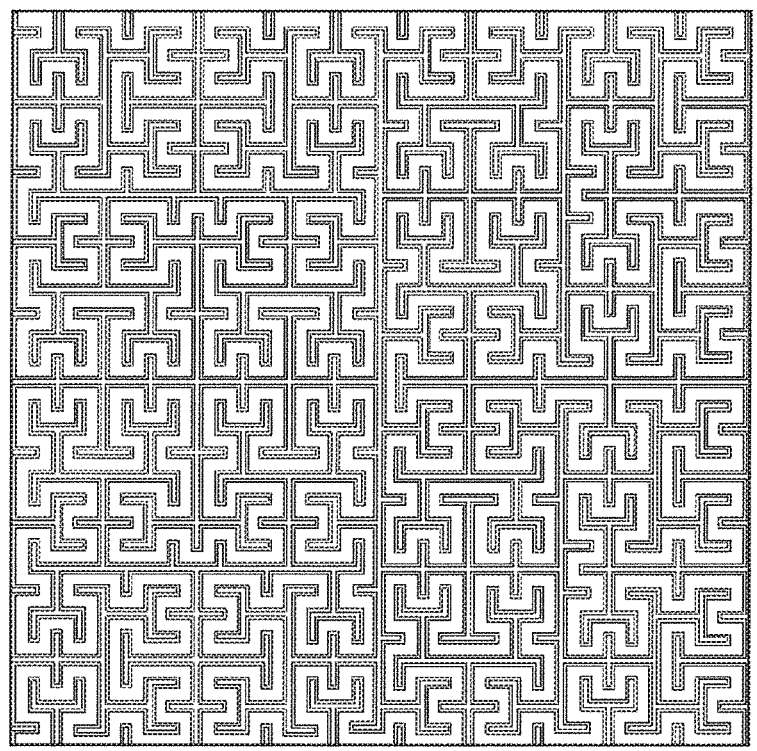
FIG. 5B is a diagram illustrating a concavo-convex pattern (space-filling curve pattern) as a basis of a concavo-convex structure in the interface of the high refractive index layer and the low refractive index layer in the light extraction layer in FIG. 4.

FIGS. 5A and 5B are each a diagram illustrating a concavo-convex pattern as a basis of the concavo-convex structure at the interface between the high refractive index layer and the low refractive index layer in the light extraction layer in FIG. 4. FIG. 5A illustrates a diffraction grating pattern, and FIG. 5B illustrates a space-filling curve pattern. The pattern illustrated in FIG. 5B is the same as the pattern illustrated in FIG. 1A, that is, the concavo-convex pattern by the Hilbert curve.

FIG. 4 illustrates the case where light enters from the high refractive index layer into the low refractive index layer, i.e. the light incident direction is from the high refractive index layer to the low refractive index layer. In this simulation, light transmittance was optically analyzed using incident light angles θ and φ in FIG. 4 as parameters.

Figure 6A:
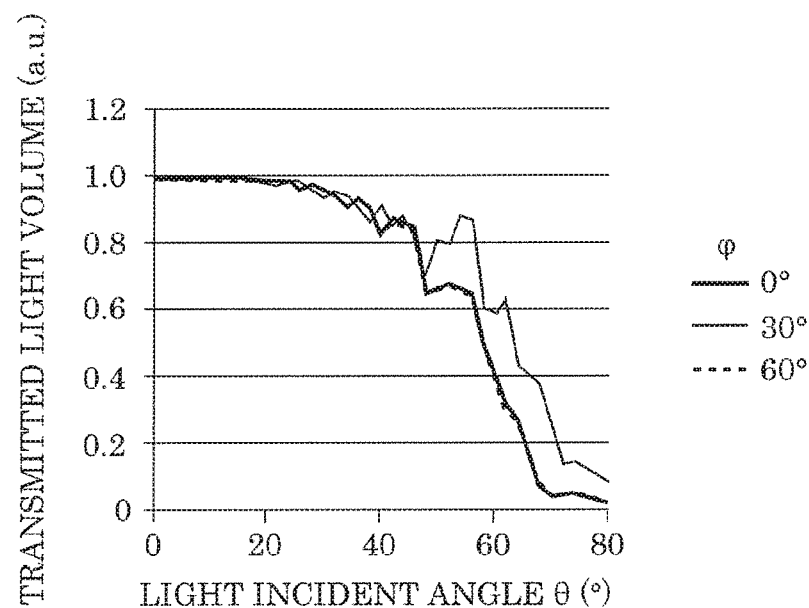
FIG. 6A is a diagram illustrating the relationship between light incident angle θ and transmitted light volume in the case where the concavo-convex pattern of the concavo-convex structure of the light extraction layer in FIG. 4 is a diffraction grating pattern.
Figure 6B:
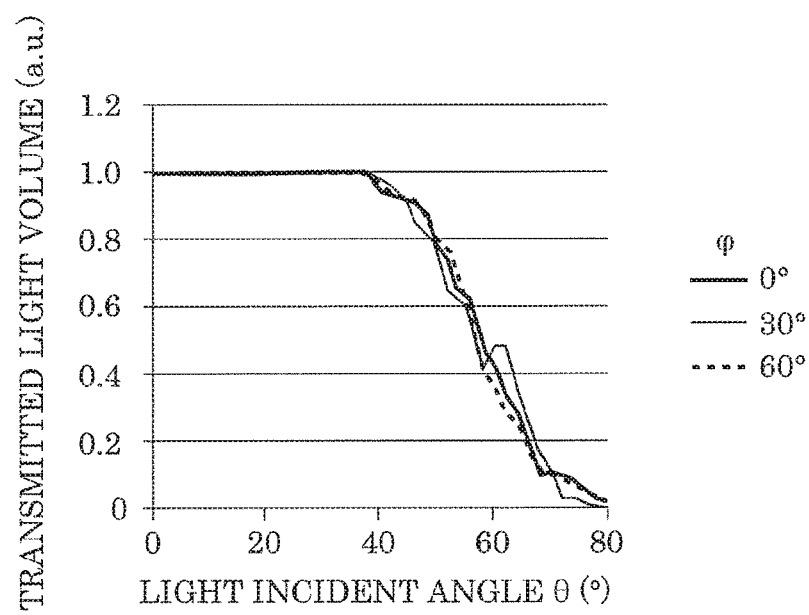
FIG. 6B is a diagram illustrating the relationship between light incident angle θ and transmitted light volume in the case where the concavo-convex pattern of the concavo-convex structure of the light extraction layer in FIG. 4 is a space-filling curve pattern.

FIGS. 6A and 6B illustrate the simulation results. FIGS. 6A and 6B each illustrate the relationship (direction dependence of transmittance) between light incident angle θ and the transmitted light volume in the concavo-convex structure of the light extraction layer illustrated in FIG. 4. FIG. 6A illustrates the direction dependence of transmittance in the case where the concavo-convex pattern of the concavo-convex structure is a diffraction grating pattern (FIG. 5A). FIG. 6B illustrates the direction dependence of transmittance in the case where the concavo-convex pattern of the concavo-convex structure is a space-filling curve pattern (FIG. 5B).

The results in FIGS. 6A and 6B demonstrate that, by changing the concavo-convex pattern of the concave-convex structure in the light extraction layer from a diffraction grating pattern to a space-filling curve pattern, the transmitted light volume (light transmittance) at the critical angle or more can be improved while reducing the direction dependence of light transmittance.

Figure 7A:
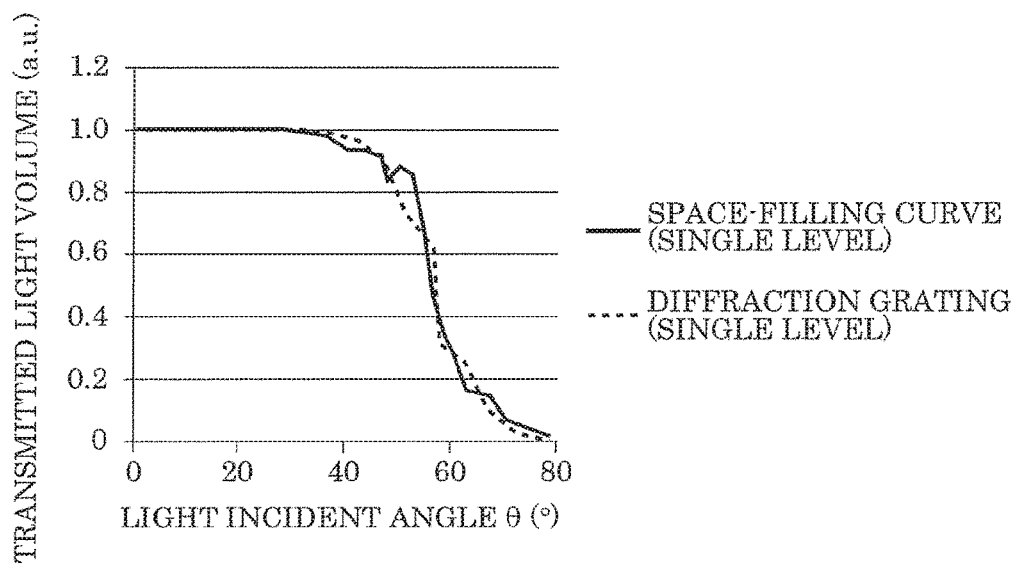
FIG. 7A is a diagram illustrating the relationship between light incident angle θ and transmitted light volume in the case where the convex portion of the concavo-convex structure of the light extraction layer in FIG. 4 is single level.
Figure 7B:
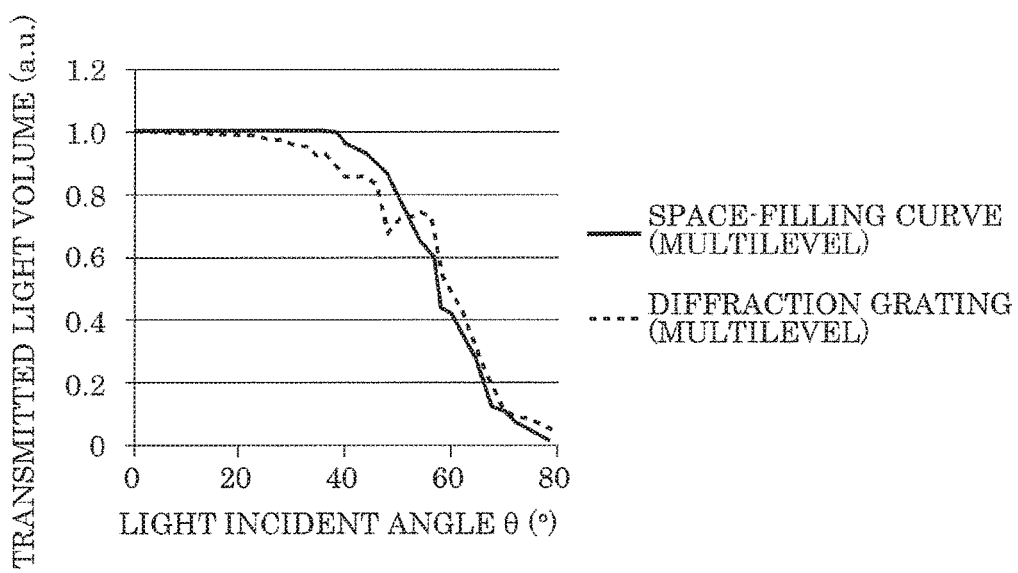
FIG. 7B is a diagram illustrating the relationship between light incident angle θ and transmitted light volume in the case where the convex portion of the concavo-convex structure of the light extraction layer in FIG. 4 is multilevel.

The simulation results in FIGS. 7A and 7B indicate the relationship (direction dependence of transmittance) between light incident angle θ the transmittance in the concavo-convex structure of the light extraction layer illustrated in FIG. 4. FIG. 7A illustrates the direction dependence of transmittance in the case where the convex portion of the concavo-convex structure has only one step (single level). FIG. 7B illustrates the direction dependence of transmittance in the case where the convex portion of the concavo-convex structure has two steps (multilevel). FIGS. 7A and 7B each illustrate the results in the case where the concavo-convex pattern of the concavo-convex structure is the diffraction grating pattern in FIG. 5A and the results in the case where the concavo-convex pattern of the concavo-convex structure is the space-filling curve pattern FIG. 5B.

Figure 8:
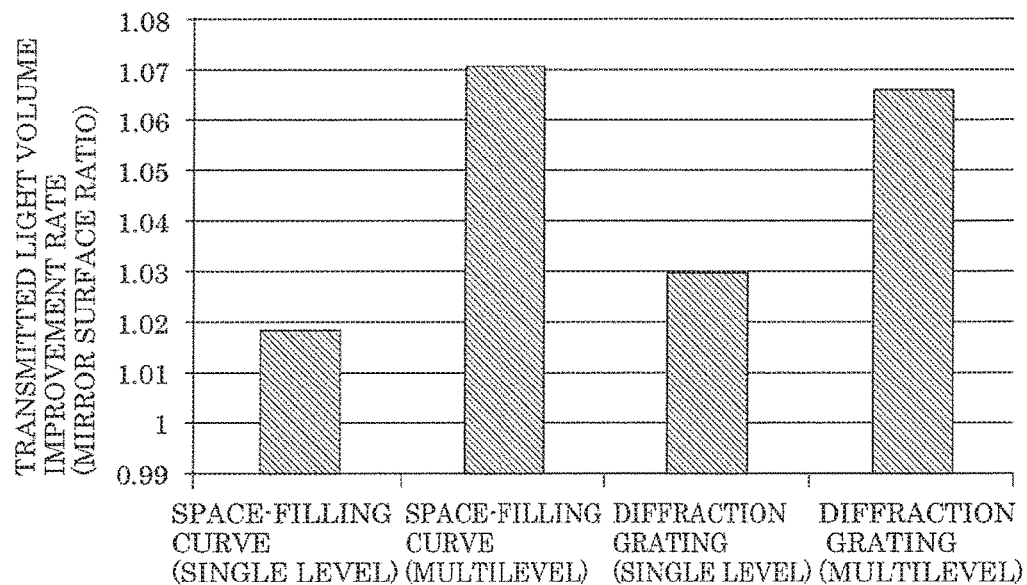
FIG. 8 is a diagram illustrating the relationship between the concavo-convex pattern of the concavo-convex structure in the light extraction layer in FIG. 4 and the transmitted light volume improvement rate.

FIG. 8 is a diagram illustrating the relationship between the concavo-convex pattern of the concavo-convex structure in the light extraction layer in FIG. 4 and the transmitted light volume improvement rate. FIG. 8 illustrates the results of calculating the transmitted light volume improvement rate based on the light transmittance (light transmission volume) in FIGS. 7A and 7B. In FIG. 8, the transmitted light volume improvement rate of each pattern indicates a ratio with the case where the interface between the high refractive index layer and the low refractive index layer in FIG. 4 is a mirror surface being set to 1.

In FIGS. 7A, 7B, and 8, "space-filling curve (single level)" indicates the results in the case where the concavo-convex pattern of the concavo-convex structure at the interface between the high refractive index layer and the low refractive index layer is the space-filling curve pattern and the convex portion of the concavo-convex structure has only one step. "Diffraction grating (single level)" indicates the results in the case where the concavo-convex pattern of the concavo-convex structure at the interface between the high refractive index layer and the low refractive index layer is the diffraction grating pattern and the convex portion of the concavo-convex structure has only one step. "Space-filling curve (multilevel)" indicates the results in the case where the concavo-convex pattern of the concavo-convex structure at the interface between the high refractive index layer and the low refractive index layer is the space-filling curve pattern and the convex portion of the concavo-convex structure has two steps. "Diffraction grating (multilevel)" indicates the results in the case where the concavo-convex pattern of the concavo-convex structure at the interface between the high refractive index layer and the low refractive index layer is the diffraction grating pattern and the convex portion of the concavo-convex structure has two steps.

As can be understood from the results in FIGS. 7A, 7B, and 8, the use of the space-filling curve pattern as the concavo-convex pattern enables in-plane arrangement without a decrease in linear density. Moreover, through the use of the space-filling curve pattern as the concavo-convex pattern, the transmitted light volume improvement rate can be maintained as compared with the case of using the diffraction grating pattern as the concavo-convex pattern.

Furthermore, by using the space-filling curve pattern as the concavo-convex pattern of the concave-convex structure of the light extraction layer and also forming the convex portion with two steps (multilevel), the transmitted light volume can be improved greatly. The light extraction efficiency in the light extraction layer can thus be improved.

Figure 9:
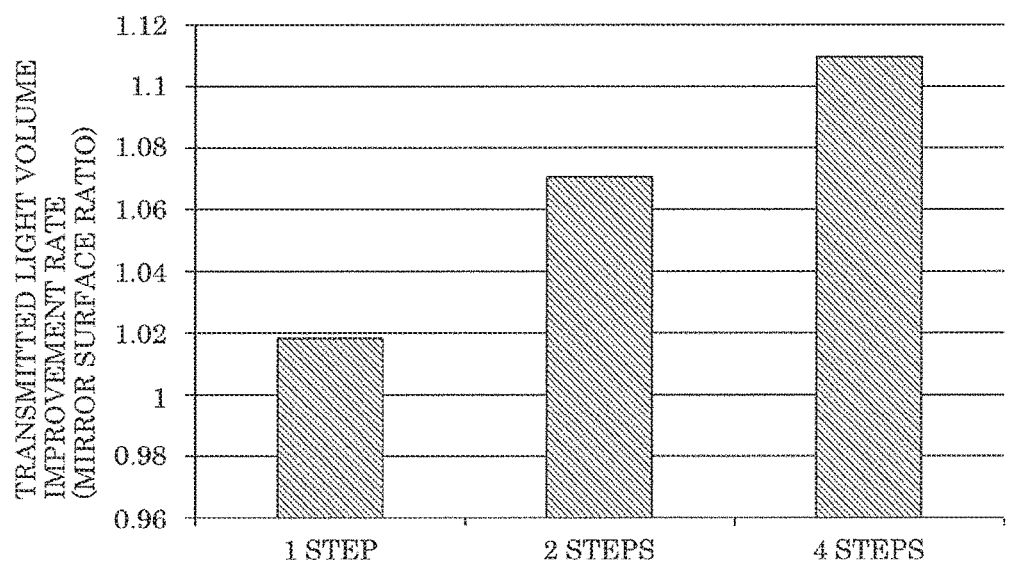
FIG. 9 is a diagram illustrating the relationship between the number of steps of the convex portion and the transmitted light volume improvement rate in the case of using a space-filling pattern as the concavo-convex pattern of the concavo-convex structure in the light extraction layer in FIG. 4.

FIG. 9 is a diagram illustrating the relationship between the number of steps of the convex portion and the transmitted light volume improvement rate in the case of using the space-filling pattern as the concavo-convex pattern of the concavo-convex structure in the light extraction layer in FIG. 4. FIG. 9 illustrates the dependence on the number of steps of the convex portion of the concavo-convex structure. In FIG. 9, too, the transmitted light volume improvement rate indicates a ratio with the case where the interface between the high refractive index layer and the low refractive index layer in FIG. 4 is a mirror surface being set to 1.

The results in FIG. 9 demonstrate that, in the case of using the space-filling pattern as the concavo-convex pattern of the concavo-convex structure in the light extraction layer, the transmitted light volume improvement rate is improved by increasing the number of steps of the convex portion of the concave-convex structure. Thus, the light extraction efficiency in the light extraction layer can be improved by increasing the number of steps of the convex portion of the concavo-convex structure.

As described above, in light-emitting device 1 according to this embodiment, convex portion 120a of the concave-convex structure of light extraction layer 120 has a structure of two or more steps (multilevel), and the concavo-convex pattern of the concavo-convex structure is formed by the space-filling curve. This achieves both randomness of convex portions 120a and minuteness of the step corners of convex portions 120a.

By randomly arranging convex portions 120a in the concavo-convex structure, light can be extracted without a directional bias. This can reduce the wavelength dependence of light extraction efficiency; and reduce the view angle dependence of chromaticity. Moreover, light extraction efficiency can be improved by the step corners of two or more steps of convex portion 120a.

Accordingly, even in the case where convex portions 120a are randomly arranged in a concavo-convex structure in order to reduce the wavelength dependence of light extraction efficiency and the view angle dependence of chromaticity, percolation can be suppressed. Excellent light extraction efficiency by convex portion 120a of two or more steps can therefore be maintained.

In this embodiment, the space-filling curve as a basis of the concavo-convex pattern of light extraction layer 120 is a Hilbert curve.

Thus, such a concavo-convex pattern that achieves both randomness of convex portions 120a and minuteness of the step corners of convex portions 120a can be obtained easily.

Figure 10:
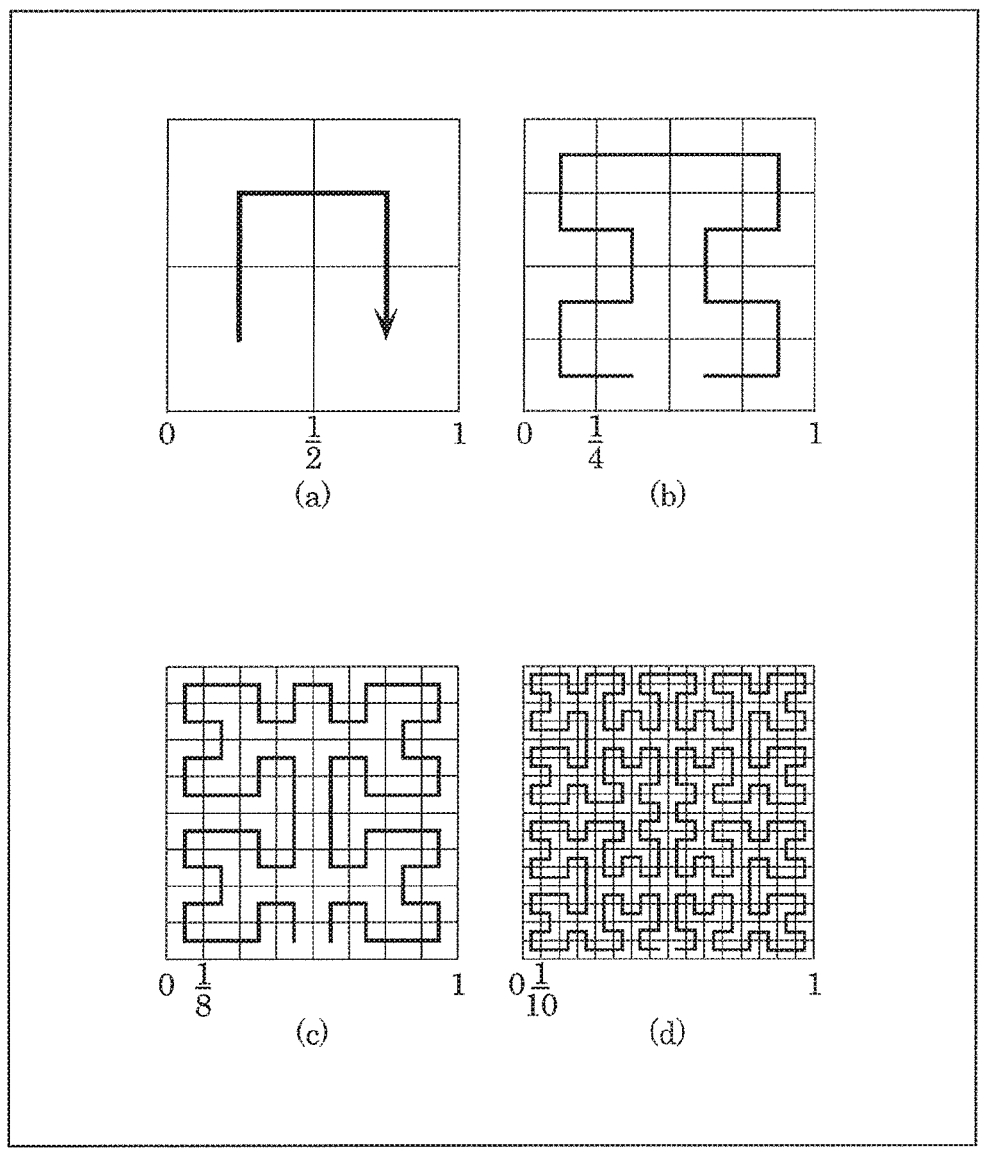
FIG. 10 is a diagram illustrating a curve as a basis of a concave-convex pattern of a concavo-convex structure of a light extraction layer in a light-emitting device according to Variation 1 of Embodiment 1.

As the space-filling curve as a basis of the concavo-convex pattern of light extraction layer 120, a Moore version of a Hilbert curve may be used as illustrated in (a) to (d) FIG. 10.

Figure 11:
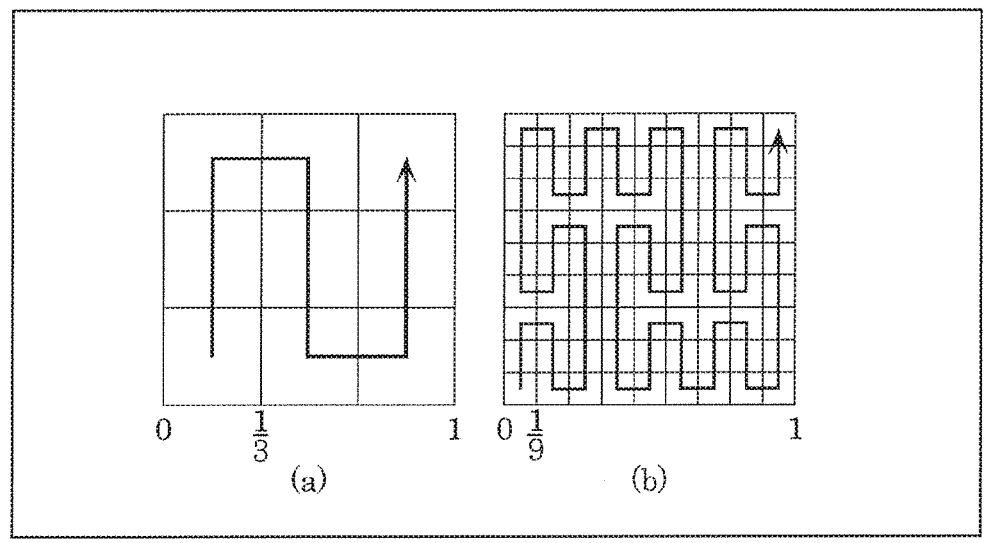
FIG. 11 is a diagram illustrating a curve as a basis of a concavo-convex pattern of a concavo-convex structure of a light extraction layer in a light-emitting device according to Variation 2 of Embodiment 1.
Figure 12:
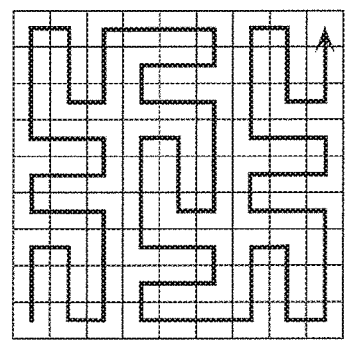
FIG. 12 is a diagram illustrating a curve as a basis of a concavo-convex pattern of a concavo-convex structure of a light extraction layer in a light-emitting device according to Variation 3 of Embodiment 1.

As the space-filling curve as a basis of the concavo-convex pattern of light extraction layer 120, a Peano curve may be used as illustrated in (a) and (b) in FIG. 11. In such a case, a switchback-type Peano curve may be used as illustrated in FIG. 12.

Figure 13:
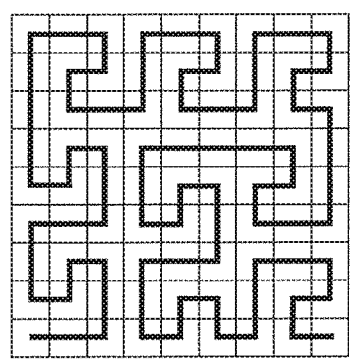
FIG. 13 is a diagram illustrating a curve as a basis of a concavo-convex pattern of a concavo-convex structure of a light extraction layer in a light-emitting device according to Variation 4 of Embodiment 1.
Figure 14:
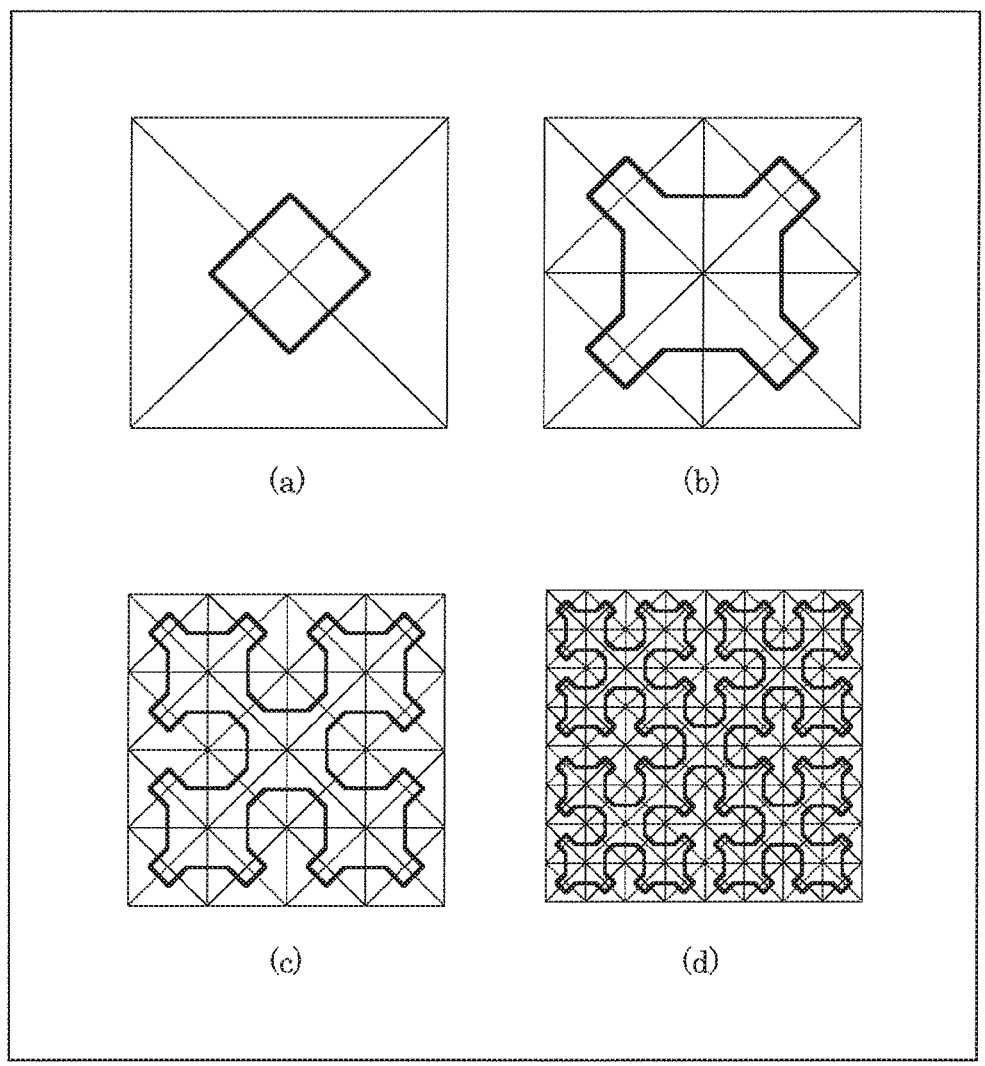
FIG. 14 is a diagram illustrating a curve as a basis of a concavo-convex pattern of a concavo-convex structure of a light extraction layer in a light-emitting device according to Variation 5 of Embodiment 1.

As the space-filling curve as a basis of the concavo-convex pattern of light extraction layer 120, a meandering Peano curve may be used as illustrated in FIG. 13, or a Sierpinski curve may be used as illustrated in (a) to (d) in FIG. 14.

In the case where any of these curves is used as the space-filling curve as a basis of the concavo-convex pattern of light extraction layer 120, too, such a concavo-convex pattern that achieves both randomness of convex portions 120a and minuteness of the step corners of convex portions 120a can be obtained easily. The concavo-convex pattern of light extraction layer 120 is not limited to the above-mentioned curves, and may be formed using other space-filling curves.

In the concave-convex pattern of light extraction layer 120, all of the plurality of convex portions 120a may have two or more steps.

Thus, the light extraction efficiency improving effect by convex portion 120a having two or more steps can be maximized.

In this embodiment, light-emitting layer 111 is an organic light-emitting layer.

Thus, light-emitting device 1 having organic EL, layer 110 (organic EL element) as a light source can be provided.

Embodiment 2

Figure 15A:
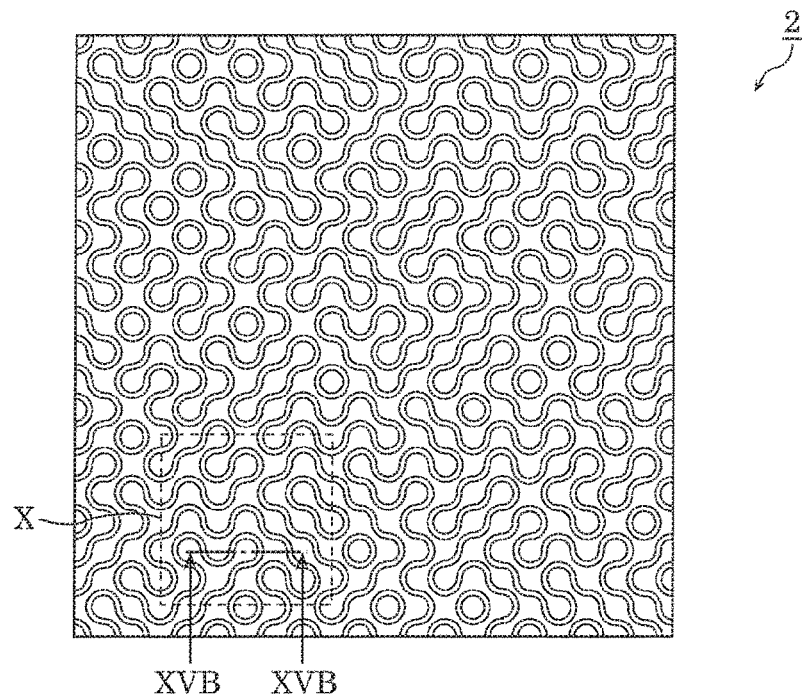
FIG. 15A is a plan view of a light-emitting device according to Embodiment 2.
Figure 15B:
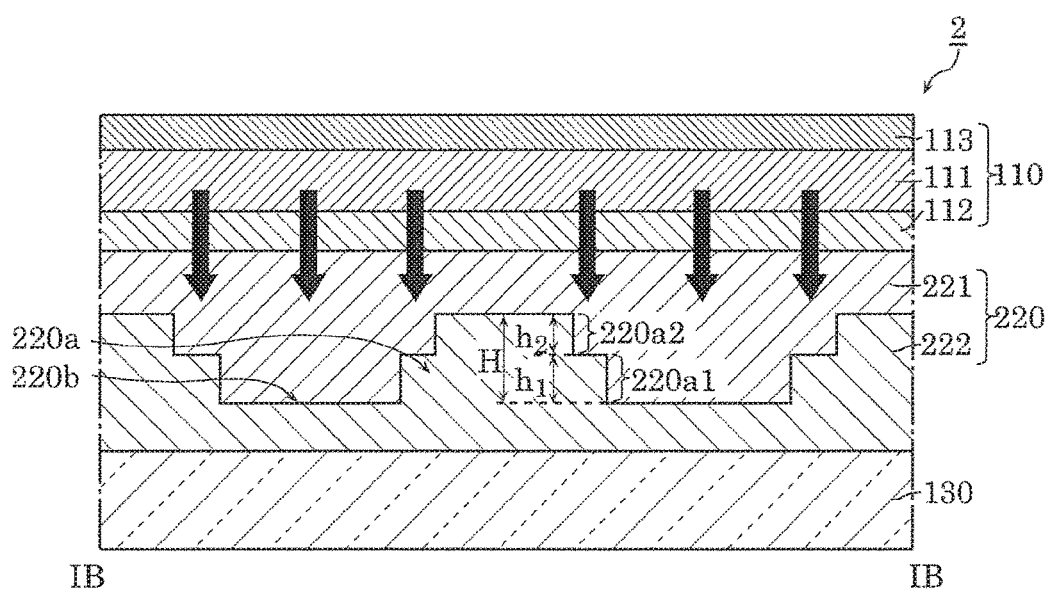
FIG. 15B is a sectional view of the light-emitting device according to Embodiment 2 along XVB-XVB line in FIG. 15A.
Figure 16:
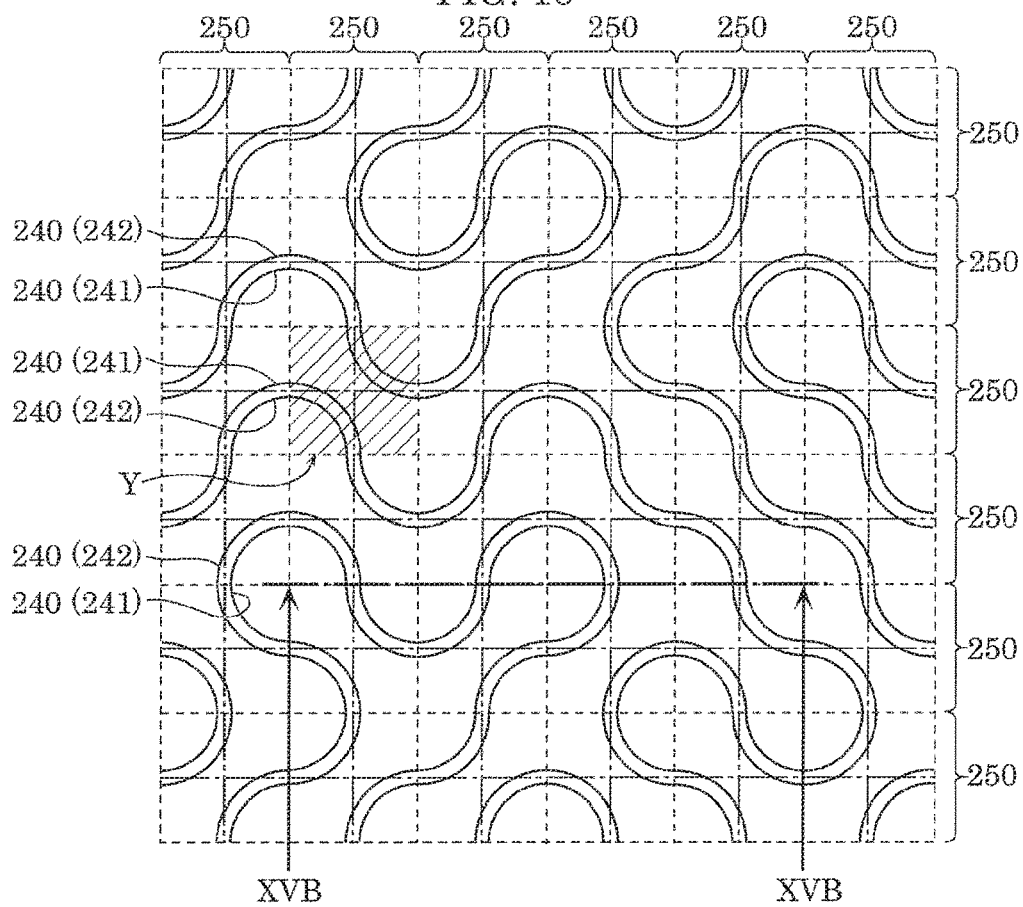
FIG. 16 is an enlarged view of region X in FIG. 15A.

The structure of light-emitting device 2 according to Embodiment 2 is described below, with reference to FIGS. 15A, 15B, and 16. FIG. 15A is a plan view of light-emitting device 2 according to Embodiment 2, and illustrates a concavo-convex pattern of a concavo-convex structure of light extraction layer 220 as seen through organic EL layer 110. FIG. 15B is a sectional view of light-emitting device 2 along XVB-XVB line in FIGS. 15A and 16. FIG. 16 is an enlarged view of region X in FIG. 15A.

As illustrated in FIGS. 15A and 15B, light-emitting device 2 is a surface emitting device which surface-emits light, and includes: organic EL layer 110; light extraction layer 220 located on the light-emitting side of organic EL layer 110; and substrate 130. Light-emitting device 2 is surrounded by an air layer (atmosphere), and the surface of substrate 130 is exposed to the air layer.

Organic EL layer 110 is provided on light extraction layer 220. Moreover, organic EL layer 110 is provided above substrate 130. In this embodiment, too, organic EL layer 110 emits light toward substrate 130 located below, as indicated by arrows in FIG. 15B. In other words, light-emitting device 2 is a bottom emission-type light-emitting device, as in Embodiment 1.

Light extraction layer 220 is located on the light-emitting side (light extraction side) of organic EL layer 110. Light extraction layer 220 is a light transmissive layer, and causes light emitted from organic EL layer 110 to enter substrate 130. In detail, light extraction layer 220 is provided on substrate 130. Light extraction layer 220 is thus provided between substrate 130 and organic EL layer 110. By providing light extraction layer 220, light from organic EL layer 110 can be extracted efficiently, thus improving the light extraction efficiency of light-emitting device 2.

Light extraction layer 220 includes first layer 221 (first light extraction layer) and second layer 222 (second light extraction layer), as with light extraction layer 120 in Embodiment 1. Light extraction layer 220 (first layer 221 and second layer 222) is, for example, an optical sheet made of a transparent resin material in sheet shape, and can be produced by nanoimprint or the like.

First layer 221 is located on the light-emitting side of light-emitting layer 111. In detail, first layer 221 is provided on the whole surface on the light-emitting side (light extraction side) of organic EL layer 110. First layer 221 transmits light from organic EL layer 110, toward second layer 222.

Second layer 222 is located on the light-emitting side of first layer 221, and is in contact with first layer 221. In detail, second layer 222 is provided on the whole surface on the light-emitting side (light extraction side) of first layer 221. Second layer 222 is in contact with substrate 130. Second layer 222 transmits light from first layer 221, toward substrate 130.

In light extraction layer 220, the refractive index of first layer 221 is higher than the refractive index of second layer 222. In other words, first layer 221 is a high refractive index layer, and second layer 222 is a low refractive index layer. When the refractive index (effective refractive index) of first layer 221 is denoted by $n_1$ and the refractive index (effective refractive index) of second layer 222 is denoted by $n_2$, first layer 221 and second layer 222 satisfies the relationship of $n_1 > n_2$.

The refractive index ($n_1$) of first layer 221 is, for example, $1.51 \leq n_1 \leq 1.90$. In this embodiment, too, $n_1 = 1.80$. The refractive index ($n_2$) of second layer 222 is $1.01 \leq n_2 \leq 1.51$. In this embodiment, too, $n_2 = 1.50$.

When the refractive index of the air layer outside substrate 130 is denoted by no (e.g. $n_0 = 1$), the refractive index of substrate 130 is denoted by $n_3$, and the refractive index of light-emitting layer 111 is denoted by $n_4$, a relational expression of $n_4 \geq n_1 \geq n_3 \geq n_0$ may be satisfied. The refractive index of second layer 222 only needs to satisfy the relationship of $n_2 > n_2$ as mentioned above, and does not necessarily need to satisfy $n_2 > n_3$.

In light extraction layer 220, a concavo-convex structure (light extraction structure) composed of a plurality of convex portions 220a having two or more steps (multilevel) is formed at the boundary between first layer 221 and second layer 222. In other words, the interface between first layer 221 and second layer 222 is a concavo-convex surface.

In detail, the concavo-convex structure of light extraction layer 220 is a structure in which a plurality of nano-order (1 μm at the maximum) fine convex portions 220a and concave portions 220b are arranged. All of the plurality of convex portions 220a in the concavo-convex structure may have two or more steps. In other words, the plurality of convex portions 220a may include no convex portion having only one step (single level).

In this embodiment, all of the plurality of convex portions 220a (concave portions 220b) have a two-step structure of two steps (double level), as in Embodiment 1. In detail, each convex portion 220a is composed of first step portion 220a1 and second step portion 220a2 located on first step portion 220a1. The diameter of first step portion 220a1 is greater than the diameter of second step portion 220a2.

When the height (length in the stack direction) of each convex portion 220a is denoted by H, for example, $0.2 \mu m \leq H \leq 20 \mu m$. When, in each convex portion 220a, the height of first step portion 220a1 is denoted by $h_1$ and the height of second step portion 220a2 is denoted by $h_2$, for example, $0.1 \mu m \leq h_1 \leq 10 \mu m$ and $0.1 \leq h_2 \leq 10 \mu m$.

The concavo-convex pattern of the concavo-convex structure composed of the plurality of convex portions 220a in light extraction layer 220 is a fractal tiling pattern, as illustrated in FIGS. 15A and 16. In detail, contour 240 of the step corner (edge) of convex portion 220a of the concavo-convex structure in light extraction layer 220 in a plan view of light-emitting device 2 is a fractal tiling pattern.

In detail, the concavo-convex pattern of light extraction layer 220 is a pattern obtained by assigning, in the case where the whole concavo-convex pattern is divided into square virtual unit regions (fine regions) 250 with no gap, a randomly rotated predetermined unit pattern to each virtual unit region 250. In other words, the concavo-convex pattern of light extraction layer 220 is a pattern obtained by arranging randomly rotated predetermined square unit patterns with no gap. In this embodiment, the whole region of the concave-convex pattern in light extraction layer 220 is a rectangular region in which square virtual unit regions 250 are arranged in a matrix. The concavo-convex pattern is evenly divided by square virtual unit regions 250, where the plurality of virtual unit regions 250 have the same shape and the same size.

The predetermined unit pattern assigned to each virtual unit region 250 in the concave-convex pattern of light extraction layer 220 is composed of contour 240 representing the steps of convex portion 220a. Thus, each unit pattern represents the trajectory of contour 240 of the step corner (edge) of convex portion 220a. In this embodiment, convex portion 220a has two steps. Accordingly, contour 240 includes first contour 241 representing the first step and second contour 242 representing the second step, as illustrated in FIG. 16.

Figure 17A:
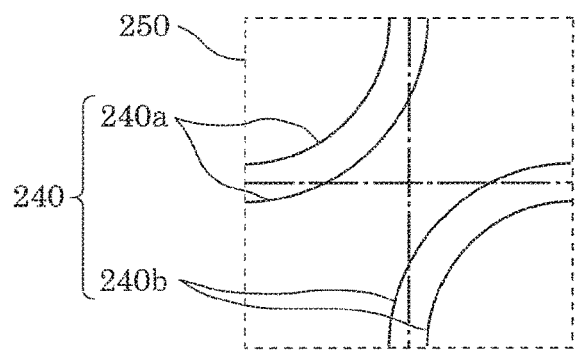
FIG. 17A is a diagram illustrating a unit pattern of a concavo-convex structure of a light extraction layer in the light-emitting device according to Embodiment 2.
Figure 17B:
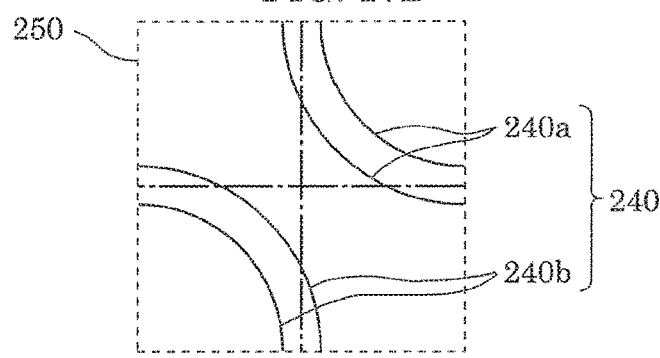
FIG. 17B is a diagram illustrating the unit pattern of the concavo-convex structure of the light extraction layer in the light-emitting device according to Embodiment 2.

FIG. 17A is a diagram illustrating the unit pattern (virtual unit region 250) of the concavo-convex structure of light extraction layer 220 in light-emitting device 2 according to this embodiment, and illustrates region Y indicated by hatching in FIG. 16. FIG. 17B illustrates a pattern obtained by rotating 270° the unit pattern illustrated in FIG. 17A.

In the predetermined unit pattern of each square virtual unit region 250, contour 240 representing the steps of convex portion 220a has a rotationally symmetrical shape, and is composed of first line 240a (first pattern line) connecting the respective center parts of one pair of adjacent two sides from among the four sides of the square defining virtual unit region 250; and second line 240b (second pattern line) connecting the respective center parts of the other pair of adjacent two sides from among the four sides of the square defining virtual unit region 250, as illustrated in FIG. 17A.

In this embodiment, convex portion 220a has two steps. Accordingly, contour 240 representing the steps of convex portion 220a in each predetermined unit pattern is a double line (two-line), as illustrated in FIG. 17A. Therefore, each of first line 240a and second line 240b in each predetermined unit pattern is a double line. One line of the double line of contour 240 (first line 240a and second line 240b) represents the trajectory of the step corner of the first step, and the other line of the double line represents the trajectory of the step corner of the second step. In this embodiment, contour 240 (first line 240a and second line 240b) is arc-shaped.

Each virtual unit region 250 of the concavo-convex pattern of light extraction layer 220 is assigned a pattern obtained by rotating the predetermined unit pattern illustrated in FIG. 17A so as to conform to the square defining virtual unit region 250. In detail, each virtual unit region 250 is assigned a pattern obtained by rotating 90°, 180°, or 270° the predetermined unit pattern illustrated in FIG. 17A.

Contour 240 representing the steps of convex portion 220a in the unit pattern illustrated in FIG. 17A has a rotationally symmetrical shape. Accordingly, for example rotating 90° the unit pattern illustrated in FIG. 17A yields the pattern illustrated in FIG. 17B. Rotating 180° the unit pattern illustrated in FIG. 17A yields the same pattern as that in FIG. 17A. Rotating 270° the unit pattern illustrated in FIG. 17A yields the pattern illustrated in FIG. 17B. Thus, any of the unit pattern illustrated in FIG. 17A and the unit pattern illustrated in FIG. 17B is assigned to each virtual unit region 250 in the concavo-convex pattern of light extraction layer 220.

The functions and effects of light-emitting device 2 according to this embodiment are described below, in comparison with the conventional light-emitting devices illustrated in FIGS. 2 and 3.

In the concavo-convex pattern of the light-emitting device illustrated in FIG. 2 or 3, a plurality of convex portions or concave portions are randomly arranged according to a random generation algorithm or the like. This causes percolation and results in a state where many parts of the concavo-convex pattern have no step corner of a convex portion (concave portion), leading to a decrease in light extraction efficiency.

In view of this, in light-emitting device 2 in this embodiment, the concavo-convex structure formed at the boundary between first layer 221 and second layer 222 in light extraction layer 220 located on the light-emitting side of light-emitting layer 111 is composed of a plurality of convex portions 220a having two or more steps, and the concavo-convex pattern of the concavo-convex structure is a fractal tiling pattern.

With such a concavo-convex structure in light extraction layer 220 that is composed of a plurality of convex portions 220a each having two or more steps (i.e. a multilevel concavo-convex structure), excellent light extraction efficiency can be achieved as in Embodiment 1.

Thus, with such a concavo-convex structure in light extraction layer 220 that is composed of a plurality of convex portions 220a each having two or more steps (multilevel), more propagation light in an oblique direction from the step corner (edge) of convex portion 220a (concave portion) can be generated. Since incident light can be efficiently converted to propagation light in the step portion of two or more steps of convex portion 220a (concave portion) as compared with the case where the convex portion in the concavo-convex structure has only one step (single level), light extraction efficiency can be improved greatly.

Moreover, in this embodiment, the concavo-convex pattern of the concavo-convex structure of light extraction layer 220 is a fractal tiling pattern. In detail, in this embodiment, the regularity of the concavo-convex structure is eliminated not by the presence probability of convex portion 220a, i.e. imparting randomness to the presence of convex portion 220a, but by imparting randomness to the arrangement of convex portion 220a with respect to the plurality of virtual unit regions 250 divided evenly.

In light extraction layer 220 in this embodiment, randomness is imparted to the concavo-convex structure, while filling each virtual unit region 250 of the concavo-convex pattern entirely with the step corner (edge) of convex portion 220a to suppress percolation.

In this way, propagation light by the step corner of convex portion 220a can be generated in all regions of each virtual unit region 250 to improve light extraction efficiency. Moreover, by randomly arranging convex portions 220a in the concavo-convex structure, light can be extracted without a directional bias. This can reduce the wavelength dependence of light extraction efficiency; and reduce the view angle dependence of chromaticity.

Figure 18:
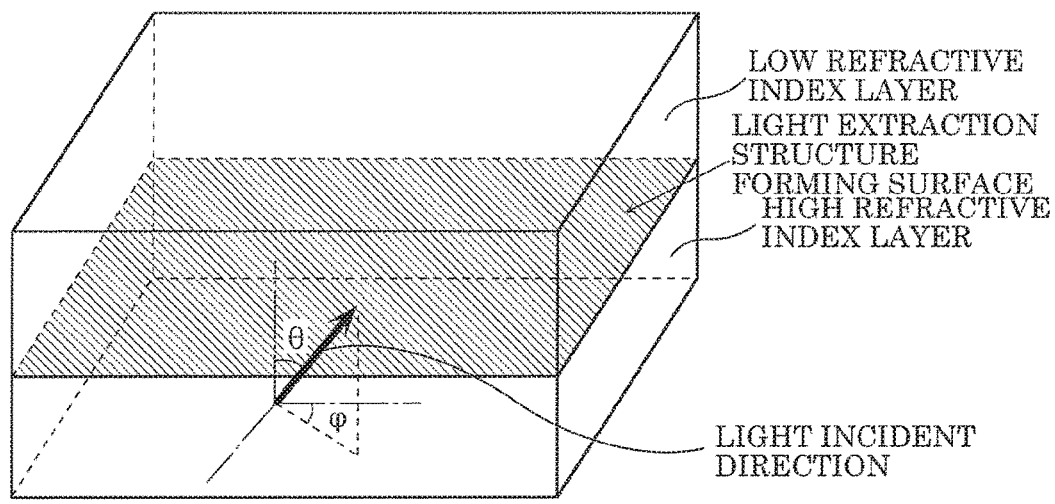
FIG. 18 is a model diagram of a light extraction layer having a stack structure of a high refractive index layer and a low refractive index layer.
Figure 19A:
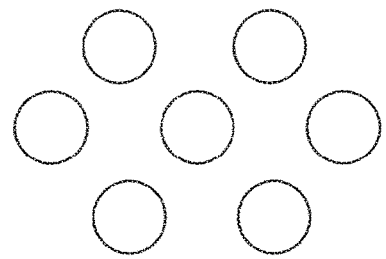
FIG. 19A is a diagram illustrating a concavo-convex pattern (diffraction grating pattern) of a concavo-convex structure in the interface of the high refractive index layer and the low refractive index layer in the light extraction layer in FIG. 18.
Figure 19B:
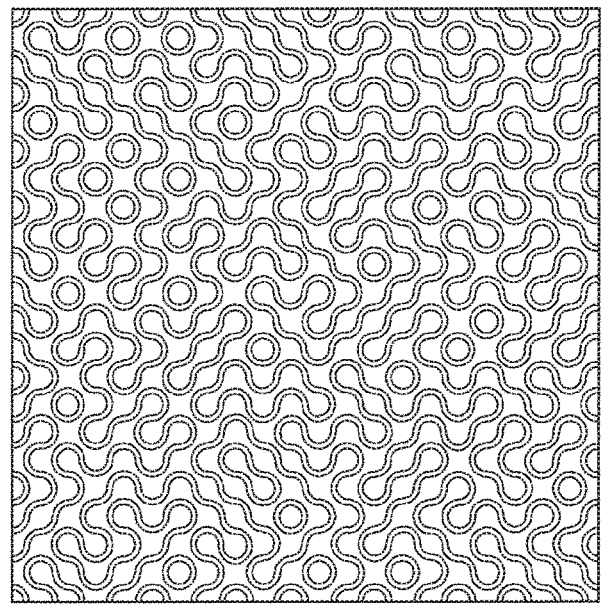
FIG. 19B is a diagram illustrating a concavo-convex pattern (fractal tiling pattern) of the concavo-convex structure in the interface of the high refractive index layer and the low refractive index layer in the light extraction layer in FIG. 18.
Figure 20:
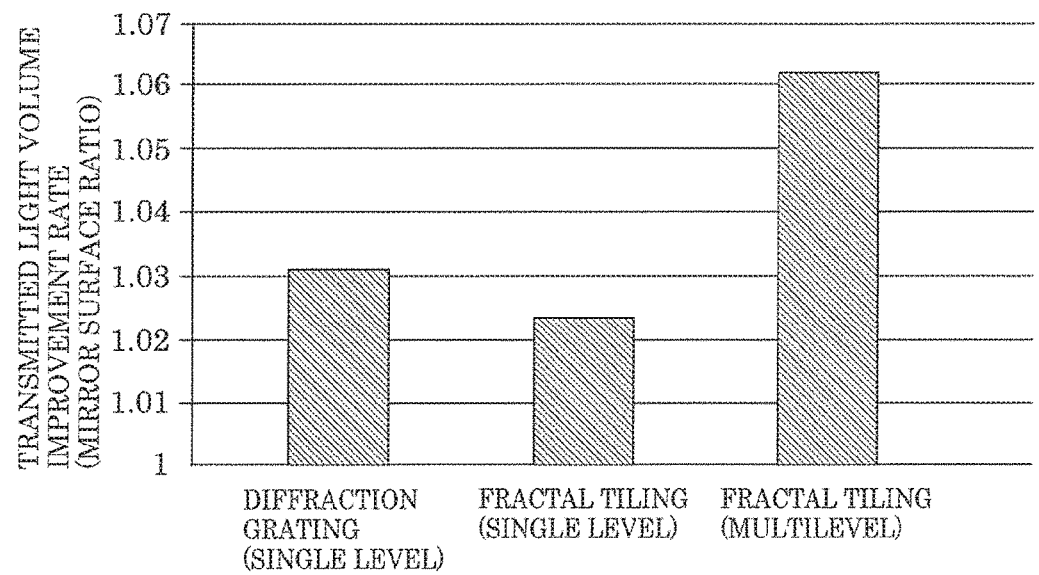
FIG. 20 is a diagram illustrating the relationship between the concavo-convex pattern of the concavo-convex structure in the light extraction layer in FIG. 18 and the transmitted light volume improvement rate.

The following describes the results of simulation for light extraction efficiency performed on two texture structures, i.e. a texture structure in the case where the concavo-convex structure of the light extraction layer has a diffraction grating pattern (comparative example) and a texture structure in the case where the concavo-convex structure of the light extraction layer has a fractal tiling pattern (this embodiment), with reference to FIGS. 18 to 20. The simulation concerns the case where the convex portion of the concavo-convex structure has only one step (single level) and the case where the convex portion of the concavo-convex structure has two steps (multilevel).

FIG. 18 is a model diagram of a light extraction layer having a stack structure of a high refractive index layer and a low refractive index layer. A concavo-convex structure is formed at the interface (light extraction structure forming surface) between the high refractive index layer and the low refractive index layer in the light extraction layer in FIG. 18.

FIGS. 19A and 19B are each a diagram illustrating the concavo-convex pattern of the concavo-convex structure at the interface between the high refractive index layer and the low refractive index layer in the light extraction layer in FIG. 18. FIG. 19A illustrates a diffraction grating pattern, and FIG. 19B illustrates a fractal tiling pattern. The pattern illustrated in FIG. 19B is the same as the pattern illustrated in FIG. 15A.

FIG. 18 illustrates the case where light enters from the high refractive index layer into the low refractive index layer, i.e. the light incident direction is from the high refractive index layer to the low refractive index layer, as in the model diagram in FIG. 4. In this simulation, too, light transmittance was optically analyzed using incident light angles θ and φ in FIG. 18 as parameters.

FIG. 20 illustrates the simulation results. FIG. 20 is a diagram illustrating the relationship between the concavo-convex pattern of the concavo-convex structure in the light extraction layer in FIG. 18 and the transmitted light volume improvement rate.

In FIG. 20, the transmitted light volume improvement rate of each pattern indicates a ratio with the case where the interface between the high refractive index layer and the low refractive index layer in FIG. 18 is a mirror surface being set to 1.

In FIG. 20, "diffraction grating (single level)" indicates the results in the case where the concavo-convex pattern of the concavo-convex structure at the interface between the high refractive index layer and the low refractive index layer is diffraction grating and the convex portion of the concavo-convex structure has only one step. "Fractal tiling (single level)" indicates the results in the case where the concavo-convex pattern of the concavo-convex structure at the interface between the high refractive index layer and the low refractive index layer is the fractal tiling pattern and the convex portion of the concavo-convex structure has only one step. "Fractal tiling (multilevel)" indicates the results in the case where the concave-convex pattern of the concavo-convex structure at the interface between the high refractive index layer and the low refractive index layer is the fractal tiling pattern and the convex portion of the concavo-convex structure has two steps.

As illustrated in FIG. 20, even when the fractal tiling pattern is used as the concavo-convex pattern of the concave-convex structure of the light extraction layer, if the convex portion has only one step (single level), the transmitted light volume does not increase as compared with the case where the concavo-convex pattern is diffraction grating, and so the transmitted light volume improvement rate is not improved.

However, by using the fractal tiling pattern as the concave-convex pattern of the concavo-convex structure of the light extraction layer and also forming the convex portion with two steps (multilevel), the transmitted light volume can be improved greatly. The light extraction efficiency in the light extraction layer can thus be improved.

As described above, in light-emitting device 2 according to this embodiment, each of the plurality of convex portions 220a in the concave-convex structure of light extraction layer 220 has two or more steps, and the concavo-convex pattern of the concave-convex structure is a fractal tiling pattern. Accordingly, even in the case where convex portions 220a are randomly arranged in a concavo-convex structure in order to reduce the wavelength dependence of light extraction efficiency and the view angle dependence of chromaticity, percolation can be suppressed. Excellent light extraction efficiency can therefore be maintained.

In this embodiment, the concavo-convex pattern of light extraction layer 220 is a pattern obtained by assigning, in the case where the concavo-convex pattern is divided into square virtual unit regions 250 with no gap, a randomly rotated predetermined unit pattern to each virtual unit region 250. Moreover, contour 240 representing the steps of convex portion 220a in the predetermined unit pattern has a rotationally symmetrical shape, and is composed of: a first line connecting the respective center parts of one pair of adjacent two sides from among the four sides of the square defining virtual unit region 250; and a second line connecting the respective center parts of the other pair of adjacent two sides from among the four sides of the square defining virtual unit region 250.

Hence, the concave-convex pattern of light extraction layer 220 is a pattern in which, in all virtual unit regions 250 except the outer peripheral end edges, contour 240 representing the steps of convex portion 220a is continuously present without a break. In detail, contour 240 is a line closed in a loop, and has no branch point. Thus, contour 240 has no open end (termination) which serves as a tip of a branch, in the regions except the outer peripheral end edges. A concavo-convex structure with no percolation can therefore be realised in all regions of the concavo-convex pattern of light extraction layer 220.

In this embodiment, first line 240a and second line 240b constituting contour 240 representing the steps of convex portion 220a are arc-shaped, as illustrated in FIG. 17A.

Thus, the trajectory of the step corner of convex portion 220a assumes a continuous smooth curve in all regions of the concavo-convex pattern of light extraction layer 220, so that the steps of convex portions 220a can be arranged evenly. This further reduces the wavelength dependence of light extraction efficiency and the view angle dependence of chromaticity, and also reduces the propagation light conversion loss in the corner of convex portion 220a. Light extraction efficiency can therefore be improved.

In the concavo-convex pattern of light extraction layer 220, all of the plurality of convex portions 220a may have two or more steps.

Thus, the light extraction efficiency improving effect by convex portion 220a having two or more steps can be maximized.

In this embodiment, too, light-emitting layer 111 is an organic light-emitting layer.

Thus, light-emitting device 2 having organic EL layer 110 (organic EL element) as a light source can be provided.

Figure 21:
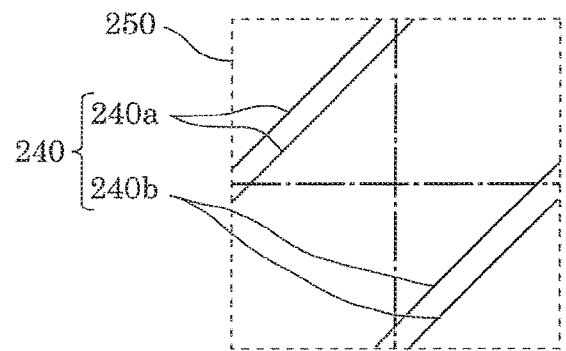
FIG. 21 is a diagram illustrating a unit pattern of a concavo-convex structure of a light extraction layer in a light-emitting device according to Variation 1 of Embodiment 2.
Figure 22:
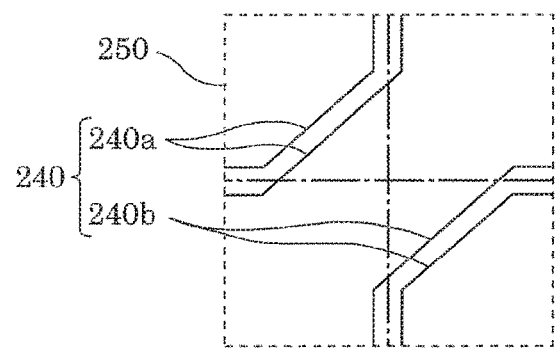
FIG. 22 is a diagram illustrating a unit pattern of a concavo-convex structure of a light extraction layer in a light-emitting device according to Variation 2 of Embodiment 2.

In Embodiment 2, the predetermined unit pattern in each virtual unit region 250 is not limited to the pattern illustrated in FIG. 17A. For example, a pattern illustrated in FIG. 21 or a pattern illustrated in FIG. 22 may be used as the predetermined unit pattern in each virtual unit region 250. In other words, the contour 240 (first line 240a and second line 240b) representing the step corner of convex portion. 220a is not limited to an arc shape. Any contour 240 that has a rotationally symmetrical shape and is composed of: first line 240a connecting the respective center parts of one pair of adjacent two sides from among the four sides of the square in virtual unit region 250; and second line 240b connecting the respective center parts of the other pair of adjacent two sides from among the four sides of the square is applicable. Here, a pattern that has the same shape when rotated 90°, 180°, and 270°, such as a cross, is undesirable as contour 240, because a regular pattern ensues even when random rotation is performed.

(Variations)

While the light-emitting device according to the present invention has been described by way of embodiments, the present invention is not limited to the foregoing Embodiments 1 and 2.

For example, although Embodiments 1 and 2 describes light-emitting device 1 as bottom emission type, light-emitting device 1 may be top emission type.

Although Embodiments 1 and 2 describes the use of organic EL layer 10 (organic EL element) as the light source of light-emitting device 1, the present invention is not limited to this. The light source of light-emitting device 1 may be any other solid light emitting element such as an inorganic EL element.

Other modifications obtained by applying various changes conceivable by a person skilled in the art to the embodiments and any combinations of the structural elements and functions in the embodiments without departing from the scope of the present invention are also included in the present invention.

The invention claimed is:

1. A light-emitting device comprising:
a light-emitting layer;
a first layer located on a light-emitting side of the light-emitting layer; and
a second layer located on a light-emitting side of the first layer, and in contact with the first layer,
wherein a boundary between the first layer and the second layer includes a concavo-convex structure composed of a plurality of convex portions having two or more steps,
a refractive index of the first layer is higher than a refractive index of the second layer, and
a concavo-convex pattern of the concavo-convex structure is a pattern formed by a space-filling curve.

2. The light-emitting device according to claim 1, wherein the space-filling curve is a Hilbert curve.

3. The light-emitting device according to claim 1, wherein the space-filling curve is a Peano curve.

4. A light-emitting device comprising:
a light-emitting layer;
a first layer located on a light-emitting side of the light-emitting layer; and
a second layer located on a light-emitting side of the first layer, and in contact with the first layer,
wherein a boundary between the first layer and the second layer includes a concavo-convex structure composed of a plurality of convex portions having two or more steps,
a refractive index of the first layer is higher than a refractive index of the second layer, and
a concavo-convex pattern of the concavo-convex structure is a fractal tiling pattern.

5. The light-emitting device according to claim 4, wherein the concavo-convex pattern is a pattern obtained by assigning, when the concavo-convex pattern is divided into virtual unit regions with no gap, a randomly rotated predetermined unit pattern to each of the virtual unit regions, the virtual unit regions each being a square, and
a contour representing the steps in the predetermined unit pattern has a rotationally symmetrical shape, and is composed of: a first line connecting respective center parts of one pair of two adjacent sides, of the four sides of the square; and a second line connecting respective center parts of the other pair of two adjacent sides, of the four sides of the square.

6. The light-emitting device according to claim 5, wherein the first line and the second line are arc-shaped.

7. The light-emitting device according to claim 1, wherein all of the plurality of convex portions have two or more steps.

8. The light-emitting device according to claim 1, wherein the light-emitting layer is an organic electroluminescent (EL) layer.

9. The light-emitting device according to claim 1, wherein the light-emitting device is a bottom emission type device.

10. The light-emitting device according to claim 1, wherein the light-emitting device is a top emission type device.

11. The light-emitting device according to claim 4, wherein the light-emitting device is a bottom emission type device.

12. The light-emitting device according to claim 4, wherein the light-emitting device is a top emission type device.

13. The light-emitting device according to claim 1, wherein the space filling curve is a Moore version of a Hilbert curve.

14. The light-emitting device according to claim 1, where the space filling curve is a switchback type Peano curve.

15. The light-emitting device according to claim 1, wherein the space filling curve is a Sierpinski curve.

* * * * *